United States Patent
Yoon et al.

(10) Patent No.: US 7,071,570 B2
(45) Date of Patent: Jul. 4, 2006

(54) CHIP SCALE PACKAGE AND METHOD OF FABRICATING THE SAME

(75) Inventors: Joon Ho Yoon, Seoul (KR); Yong Chil Choi, Suwon (KR); Suk Su Bae, Changwon (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 50 days.

(21) Appl. No.: 10/879,157

(22) Filed: Jun. 30, 2004

(65) Prior Publication Data
US 2005/0001304 A1    Jan. 6, 2005

Related U.S. Application Data

(62) Division of application No. 10/329,519, filed on Dec. 27, 2002, now Pat. No. 6,815,257.

(30) Foreign Application Priority Data
Mar. 18, 2002    (KR)    ............................. 2002-14572

(51) Int. Cl.
*H01L 29/40* (2006.01)
(52) U.S. Cl. ........................................ 257/778; 257/737
(58) Field of Classification Search ................ 257/778, 257/737
See application file for complete search history.

(56) References Cited

U.S. PATENT DOCUMENTS

| | | | |
|---|---|---|---|
| 5,441,898 A | 8/1995 | Richards et al. | |
| 5,554,887 A * | 9/1996 | Sawai et al. | 257/737 |
| 6,177,719 B1 | 1/2001 | Huang et al. | |
| 6,187,615 B1 | 2/2001 | Kim et al. | |
| 6,205,089 B1 | 3/2001 | Itoh | |
| 6,300,686 B1 | 10/2001 | Hirano et al. | |
| 6,441,500 B1 | 8/2002 | Sumikawa et al. | |
| 6,492,198 B1 | 12/2002 | Hwang | |

FOREIGN PATENT DOCUMENTS

| | | |
|---|---|---|
| CN | 1246731 | 3/2000 |
| DE | 100 45 043 | 4/2001 |
| EP | 1 085 561 | 3/2001 |

OTHER PUBLICATIONS

Patent Abstracts of Japan, Publication No. 08-340002, Dec. 24, 2996.
Patent Abstracts of Japan, Publication No. 09-102667, Apr. 15, 1997.
Patent Abstracts of Japan, Publication No. 11-121647, Apr. 30, 1999.

* cited by examiner

*Primary Examiner*—Roy Potter
(74) *Attorney, Agent, or Firm*—Lowe Hauptman & Berner, LLP.

(57) ABSTRACT

A chip scale package has an insulating layer formed on the upper surface of a chip provided with a plurality of terminals on its one surface, a plurality of conductive layers formed on the insulating layer and spaced from each other by a designated distance so as to be connected to each of a plurality of the terminals, and a plurality of electrode surface layers formed on each of the upper surfaces of a plurality of the conductive layers.

20 Claims, 6 Drawing Sheets

PRIOR ART

FIG. 1

PRIOR ART

CHIP SCALE PACKAGE AND METHOD OF FABRICATING THE SAME

This application is a divisional of U.S. patent application Ser. No. 10/329,519 filed Dec. 27, 2002 now U.S. Pat. No. 6,815,257.

BACKGROUND OF THE INVENTION

1. Field of the Invention

The present invention relates to a chip scale package, and more particularly to a miniaturized chip scale package, which comprises a chip type device having a plurality of terminals on its one surface, and a method of fabricating the chip scale package.

2. Description of the Related Art

Generally, semiconductor devices such as transistors are packaged and these packaged devices are then mounted on a printed circuit board. Structurally, this package easily connects terminals of the semiconductor device to corresponding signal patterns of the printed circuit board and serves to protect the semiconductor device from external stresses, thereby improving reliability of the package.

In order to satisfy recent trends of miniaturization of semiconductor products, the semiconductor chip packages also have been miniaturized. Therefore, a chip scale package (also, referred to as a "Chip Size Package") has been introduced.

Figure 1:
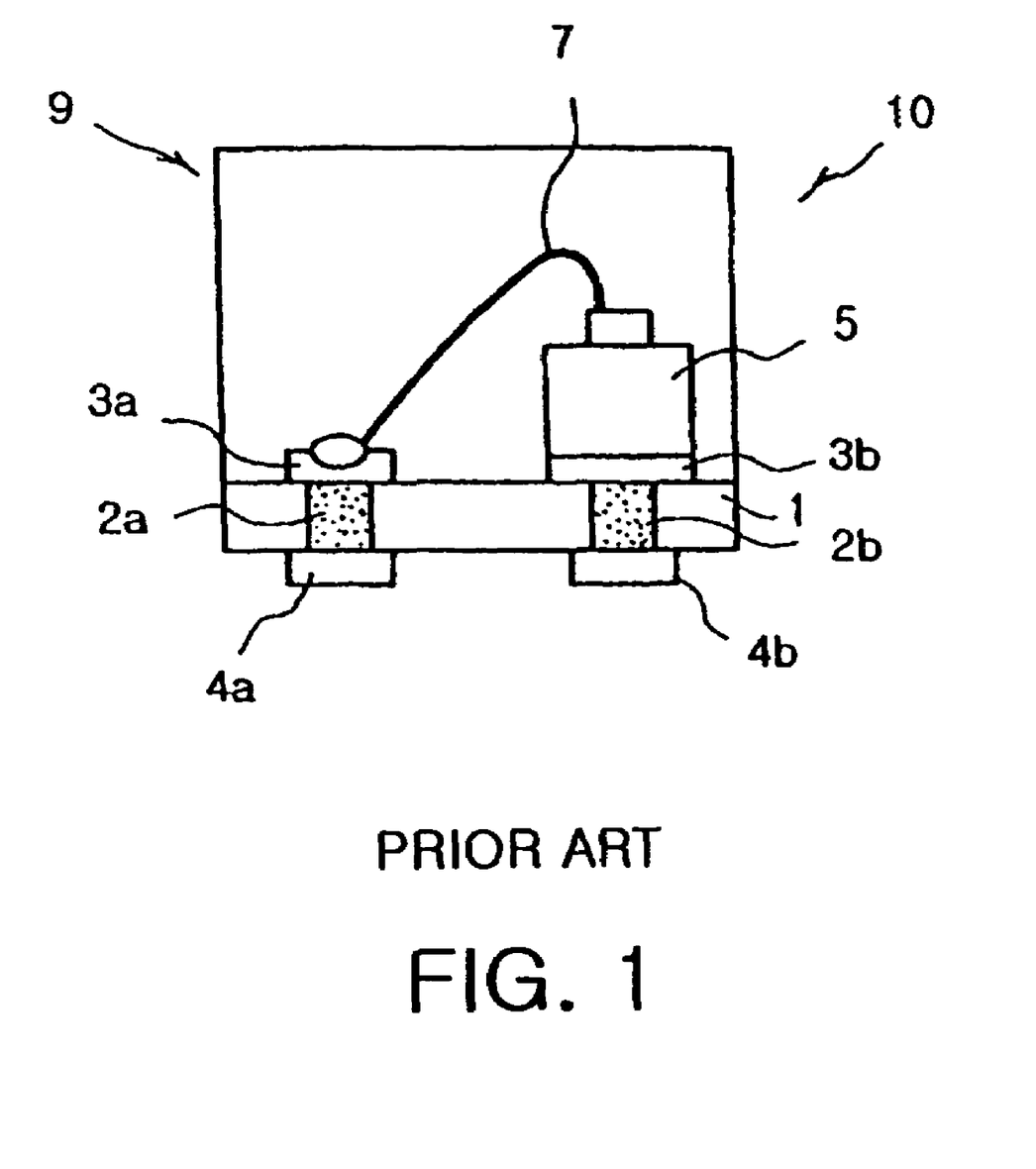
FIG. 1 is a schematic cross-sectional view of a conventional chip scale package.

FIG. 1 is a schematic cross-sectional view of a conventional chip scale package. The structure of the chip scale package 10 of FIG. 1 employs a ceramic substrate 1 and is a diode package with two terminals.

With reference to FIG. 1, two via holes, i.e., a first via hole 2a and a second via hole 2b, are formed on the ceramic substrate 1. The first and the second via holes 2a and 2b are filled with a conductive material so as to electrically connect the upper surface of the substrate 1 to the lower surface of the substrate 1. Then, a first and a second upper conductive lands 3a and 3b are formed on the upper surfaces of the first and the second via holes 2a and 2b, respectively. A first and a second lower conductive lands 4a and 4b are formed on the lower surfaces of the first and the second via holes 2a and 2b, respectively. The second upper conductive land 3b is directly connected to a terminal formed on the lower surface of the diode 5, i.e., a mounting surface of the diode 5 on a printed circuit board, and the first upper conductive land 3a is connected to the other terminal formed on the upper surface of the diode 5 by a wire 7. A molding part 9 using a conventional resin is formed on the upper surface of the ceramic substrate 1 including the diode 5 in order to protect the diode 5 from the external stresses. Thereby, the manufacture of the package 10 is completed.

Figure 2:
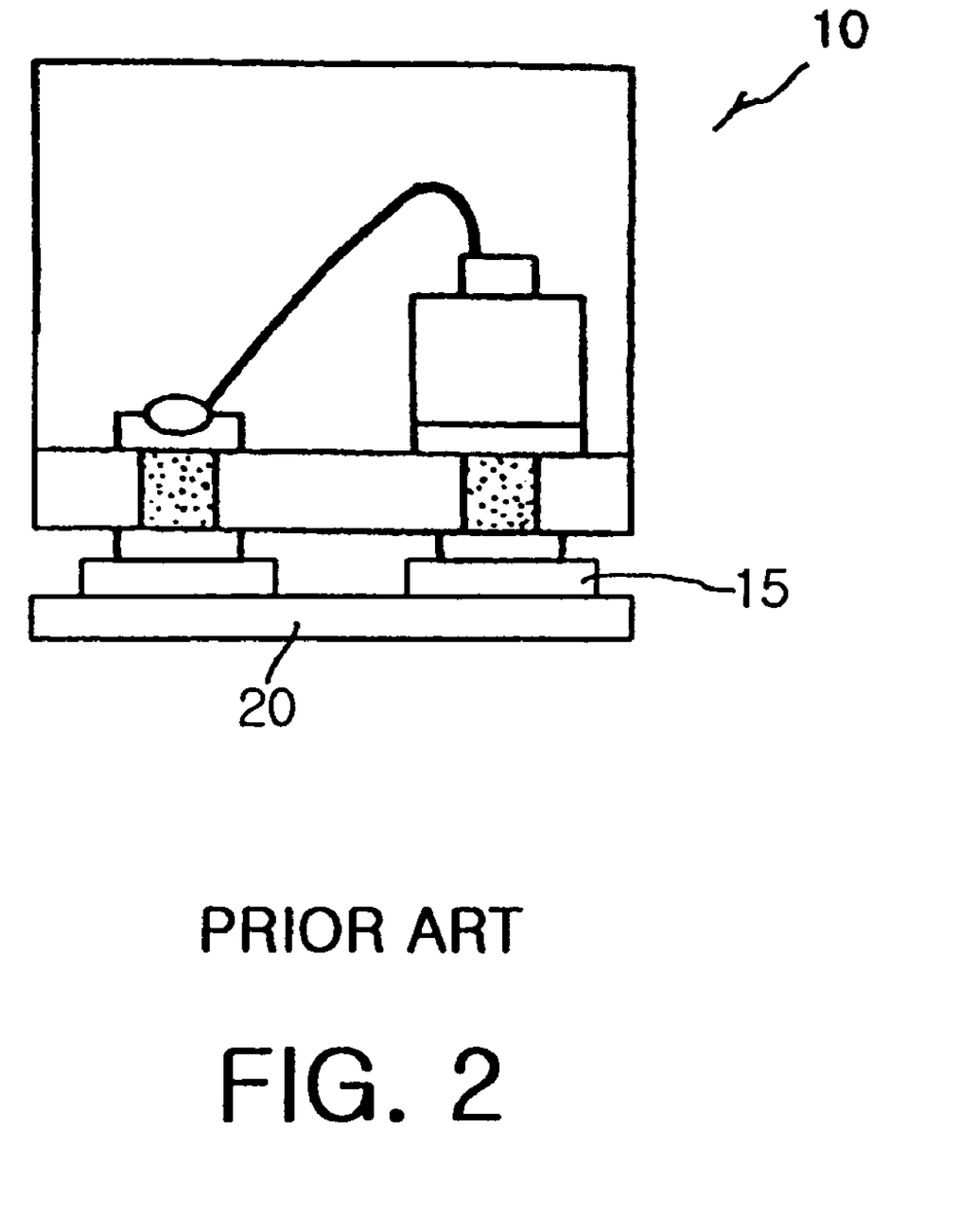
FIG. 2 is a cross-sectional view of a conventional chip scale package assembly, in which the chip scale package is mounted on a printed circuit board.

FIG. 2 is a cross-sectional view of a conventional chip scale package assembly, in which the chip scale package is mounted on the printed circuit board.

As shown in FIG. 2, the manufactured diode package 10 is mounted on the printed circuit board 20 by a reflow soldering. That is, the diode package 10 is mounted on the printed circuit board 20 by arranging the lower conductive lands 4a and 4b of the package 10 on the corresponding signal patterns of the printed circuit board 20 and by then connecting the lower conductive lands 4a and 4b to the signal patterns of the printed circuit board 20 with a solder 15.

As shown in FIGS. 1 and 2, since the chip usually has a terminal on each of its two opposite surfaces, these terminals must be interconnected by wires. However, these wires require a large space on the upper surface of the chip, thereby increasing the overall height of the package. Further, since at least two via holes, corresponding to the number of terminals of the diode, must be formed on the ceramic substrate, an area as large as the total diameters of the via holes is further required. Moreover, in order not to connect the conductive lands formed on the upper and the lower surfaces of the via holes to each other, the conductive lands must be spaced from each other by a minimum interval. Therefore, the substrate has a large size so as to satisfy the aforementioned conditions, and the size of the substrate imposes a limit in miniaturizing the package.

The above-described diode has two terminals, each formed on the upper and the lower surfaces. However, an Integrated Circuit (IC) chip having a plurality of terminals on its one surface further requires a wire bonding step or employs a proper lead frame in order to interconnect the terminals to each other. That is, devices such as the IC chips have a plurality of terminals, thereby incurring a difficulty in miniaturizing the package including the device and complicating the fabrication process of the package.

Further, the substrate, which is employed by the above-described package, is a lead frame, a printed circuit board, or a ceramic substrate. These substrates are high-priced, thereby increasing the production cost of the package. Moreover, the conventional fabrication process of the package requires a wire-bonding step and a molding step as well as a die-bonding step, thereby being very complicated.

Accordingly, a packaging technique, which can minimize the size of the package and simplify its fabricating process, has been demanded.

SUMMARY OF THE INVENTION

Therefore, the present invention has been made in view of the above problems, and it is an object of the present invention to provide a chip scale package, which is miniaturized and more simply fabricated, by forming an insulating layer on the upper surface of a chip except for terminal areas, by forming conductive layers on the insulating layer, and by forming electrode surfaces on the conductive layer so as to be connected to corresponding connection pads of a printed circuit board, thereby improving the reliability of the package.

It is another object of the present invention to provide a chip package assembly with an innovative mounting method according to the structure of the chip scale package.

It is a yet another object of the present invention to provide a method of fabricating the chip scale package.

In accordance with one aspect of the present invention, the above and other objects can be accomplished by the provision of a chip scale package comprising a chip having a plurality of terminals on its one surface, an insulating layer formed on the surface of the chip except for a plurality of terminal areas, a plurality of conductive layers formed on the insulating layer and spaced from each other by a designated distance so as to be connected to each of a plurality of the terminals, and a plurality of electrode surfaces formed on each of the upper surfaces of a plurality of the conductive layers.

In accordance with another aspect of the present invention, there is provided a chip scale package assembly comprising a chip scale package and a printed circuit board. The chip scale package comprises a chip having a plurality of terminals on its one surface, an insulating layer formed on the surface of the chip except for a plurality of terminal areas, a plurality of conductive layers formed on the insulating layer and spaced from each other by a designated distance so as to be connected to each of a plurality of the terminals, and a plurality of electrode surfaces formed on each of the upper surfaces of a plurality of the conductive layers. The printed circuit board comprises a plurality of connection pads for being connected to each of the electrode surfaces of the chip scale package, and circuit patterns connected to each of the connection pads.

In accordance with yet another aspect of the present invention, there is provided a method of fabricating a chip scale package, comprising the steps of preparing a wafer including a plurality of chips, each chip including a plurality of terminals on its one surface, forming an insulating layer on the upper surface of the wafer except for areas for forming the terminals, forming a conductive layer on the upper surface of the insulating layer so as to be connected to a plurality of the terminals, forming an electrode surface on the upper surface of the conductive layer, dividing the upper conductive layer formed on the insulating layer into two plural parts so as to connected to each of a plurality of the terminals, and dicing the wafer into a plurality of package units.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

Figure 3A:
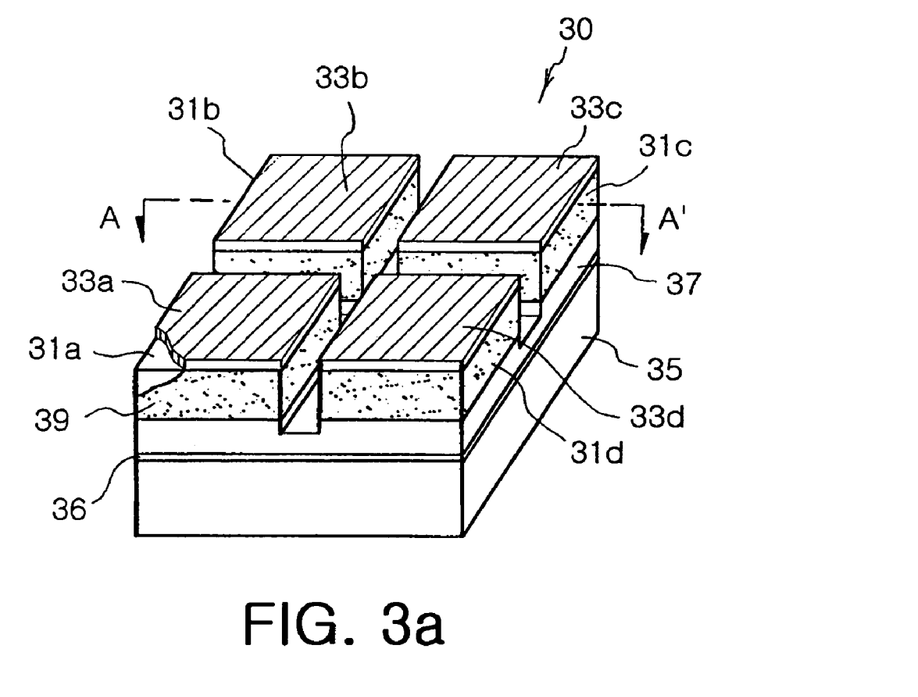
FIGS. 3a and 3b are a perspective view and a cross-sectional view of a chip scale package in accordance with a preferred embodiment of the present invention.
Figure 3B:
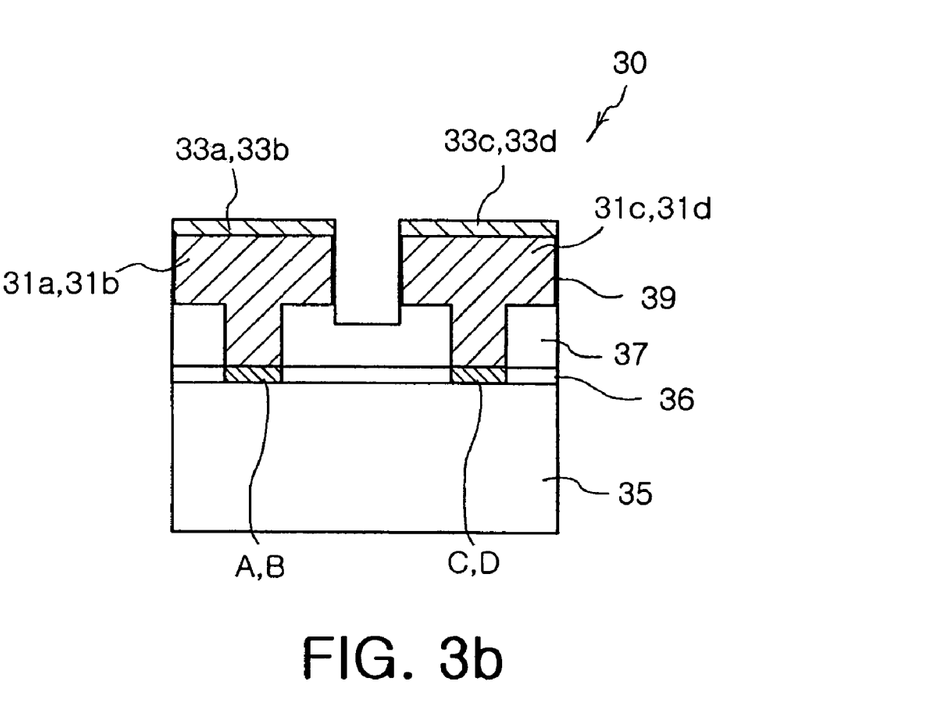

FIGS. 3a and 3b are a perspective view and a cross-sectional view of a chip scale package in accordance with a preferred embodiment of the present invention.

With reference to FIG. 3a, a chip scale package 30 comprises a chip 35 having four terminals (not shown) on its one surface. The chip scale package 30 further comprises an insulating layer 37 formed on the chip 35, four conductive layers 31a, 31b, 31c, and 31d formed on the upper surface of the insulating layer 33 and connected to each of four terminals, and four electrode surfaces 33a, 33b, 33c, and 33d formed on each of the upper surfaces of the conductive layers 31a, 31b, 31c, and 31d. Not shown in FIG. 3a, four terminals are formed on the upper surface of the chip 35 of the preferred embodiment of the present invention. However, the number of terminals of the chip is not limited thereto. That is, the number of terminals of the chip may be variously modified. The aforementioned chip 35 may be a conventional integrated circuit chip having a plurality of terminals on its one surface.

FIG. 3b describes the structure of the chip scale package 30 of the present invention in more detail. With reference to FIGS. 3a and 3b, the chip 35 comprises four terminals A, B, C, and D. The insulating layer 37 is formed on the upper surface of the chip 35 except for areas for four terminals A, B, C, and D. Generally, as shown in FIG. 3b, the terminal areas are formed by covering a mask pattern 36 with a plurality of windows on the upper surface of the chip 35 and by depositing metallic material on exposed terminal areas of the chip 35 through the windows of the mask pattern 36. Therefore, the insulating layer 37 is formed on the mask pattern 36.

Four conductive layers, i.e., the first, the second, the third, and the fourth conductive layers 31a, 31b, 31c, and 31d are formed on the upper surface of the insulating layer 37. The first, the second, the third, and the fourth conductive layers 31a, 31b, 31c, and 31d are connected to each of four terminals A, B, C, and D of the upper surface of the chip 35. The first, the second, the third, and the fourth conductive layers 31a, 31b, 31c, and 31d are spaced from each other by a designated distance. Preferably, the first, the second, the third, the fourth conductive layers 31a, 31b, 31c, and 31d are metal layers made of copper (Cu), but are not limited thereto. In order to connect the first, the second, the third, and the fourth conductive layers 31a, 31b, 31c, and 31d to each of four terminals A, B, C, and D, preferably, cavities of the insulating layer 37 are filled by a plating method. However, more preferably, a thin plating layer is formed by an electroplating method and at least one copper layer is stacked on the plating layer, thereby having a designated thickness.

The first, the second, the third, and the fourth electrode surfaces 33a, 33b, 33c, and 33d are formed on each of the upper surfaces of the first, the second, the third, and the fourth conductive layers 31a, 31b, 31c, and 31d. The first, the second, the third, and the fourth electrode surfaces 33a, 33b, 33c, and 33d serve to be electrically and mechanically connected to corresponding connection pads of a printed circuit board. Therefore, preferably, the first, the second, the third, and the fourth electrode surfaces 33a, 33b, 33c, and 33d are metal layers including gold (Au) with an excellent electric conductivity as so to subsequently perform the soldering between the first, the second, the third, and the fourth electrode surfaces 33a, 33b, 33c, and 33d, and the corresponding connection pads of the printed circuit board.

The first, the second, the third, and the fourth electrode surfaces 33a, 33b, 33c, and 33d are mounting surfaces on the printed circuit board. That is, the aforementioned chip scale package 30 is turned at an angle of 180 degrees, and the turned chip scale package 30 is then mounted on the printed circuit board so that the first, the second, the third, and the fourth electrode surfaces 33a, 33b, 33c, and 33d are connected to the corresponding connection pads of the printed circuit board.

An oxidation layer may be formed on the exposed surfaces of the first, the second, the third, and fourth conductive layers 31a, 31b, 31c, and 31d by a natural oxidation. Herein, the exposed surfaces are the side surfaces of the first, the second, the third, and fourth conductive layers 31a, 31b, 31c, and 31d (In some cases, the exposed surfaces may be parts of the upper surfaces of the first, the second, the third, and fourth conductive layers 31a, 31b, 31c, and 31d, in which the electrode surfaces are not formed.) These oxidation layers serve as layers for protecting the first, the second, the third, and the fourth conductive layers 31a, 31b, 31c, and 31d from oxidizing, thereby assuring the reliability of the first, the second, the third, and the fourth conductive layers 31a, 31b, 31c, and 31d. However, in order to prevent the first, the second, the third, and the fourth conductive layers 31a, 31b, 31c, and 31d from seriously oxidizing, a passivation layer 39 may be formed on the first, the second, the third, and the fourth conductive layers 31a, 31b, 31c, and 31d except for the surfaces provided with the first, the second, the third, and the fourth electrode surfaces 33a, 33b, 33c, and 33d.

Preferably, the passivation layer 39 is an insulation film formed by coating insulating resin. If necessary, the passivation layer 39 may be formed on the exposed side surfaces of the chip 35.

Figure 4:
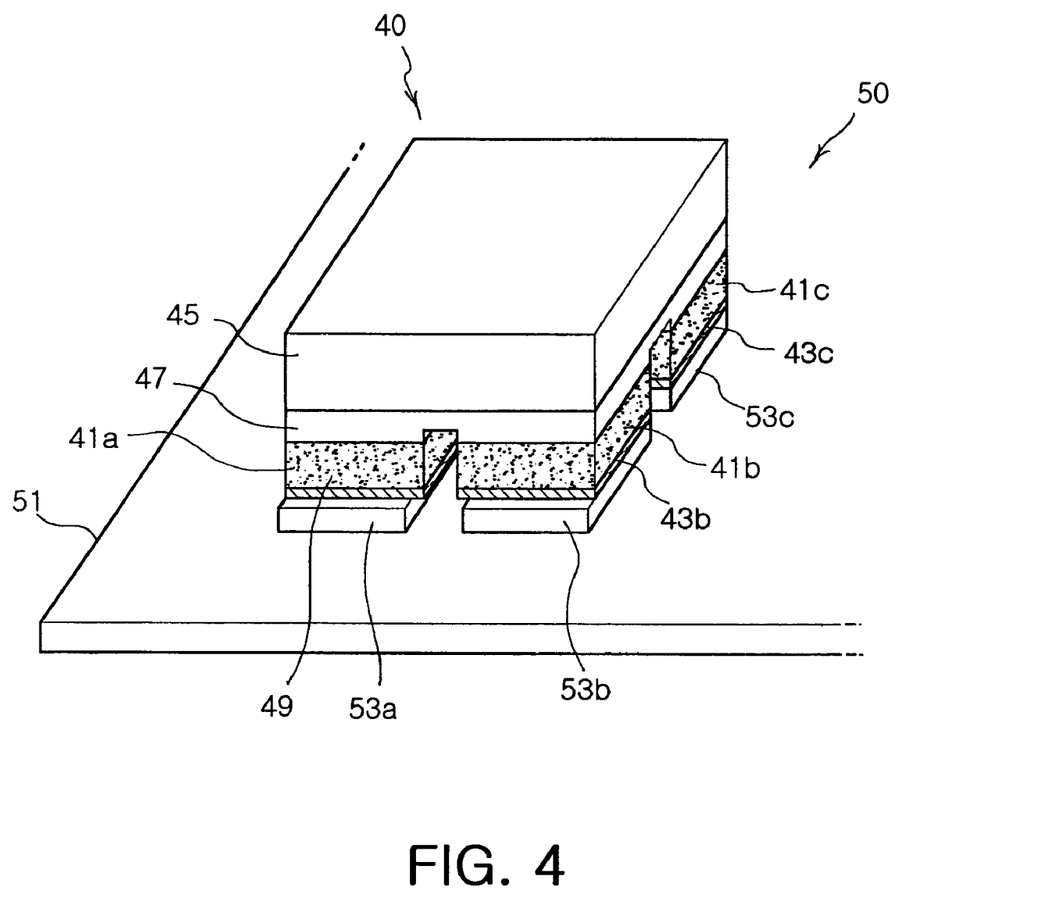
FIG. 4 is a perspective view of a chip scale package assembly, in which a chip scale package is mounted on a printed circuit board in accordance with the preferred embodiment of the present invention.

FIG. 4 is a perspective view of a chip package assembly 50, in which a chip scale package 40 is mounted on a printed circuit board 51 in accordance with the preferred embodiment of the present invention.

As shown in FIG. 4, the chip package assembly 50 comprises the chip scale package 40 and the printed circuit board 51 for mounting the chip scale package 40. As shown in FIGS. 3a and 3b, in the chip scale package 40, an insulating layer 47 is formed on the upper surface of a chip 45. Four conductive layers, i.e., the first, the second, and the third conductive layers 41a, 41b, and 41c (the fourth conductive layer is not shown) are formed on the upper surface of the insulating layer 47. The first, the second, and the third conductive layers 41a, 41b, and 41c (the fourth conductive layer is not shown) are connected to each of the terminals. Four electrode surfaces. i.e., the first, the second, and the third electrode surfaces 43a, 43b, and 43c (the fourth electrode surface is not shown) are formed on each of the upper surfaces of the first, the second, and the third conductive layers 41a, 41b, and 41c (the fourth conductive layer is not shown).

The chip scale package 40 is mounted on the printed circuit board 51 by disposing the first, the second, and the third electrode surfaces 43a, 43b, and 43c (the fourth electrode surface is not shown) on corresponding connection pads 53a, 53b, and 53c (the rest one is not shown) of the printed circuit board 51 and by performing the soldering between the first, the second, and the third electrode surfaces 43a, 43b, and 43c (the fourth electrode surface is not shown), and the connection pads 53a, 53b, and 53c (the rest one is not shown), thereby completing the fabrication of the chip package assembly 50 of FIG. 4.

Designated circuits (not shown) formed on the printed circuit board 51 are electrically connected to each terminal of the chip 45 via the first, the second, and the third conductive layers 41a, 41b, and 41c (the fourth conductive layer is not shown) provided with the first, the second, and the third electrode surfaces 43a, 43b, and 43c (the fourth electrode surface is not shown).

Further, the present invention provides a method of fabricating the aforementioned chip scale package. FIGS. 5a through 5f are perspective views illustrating each step of the method of fabricating the chip scale package in accordance with a preferred embodiment of the present invention.

Figure 5A:
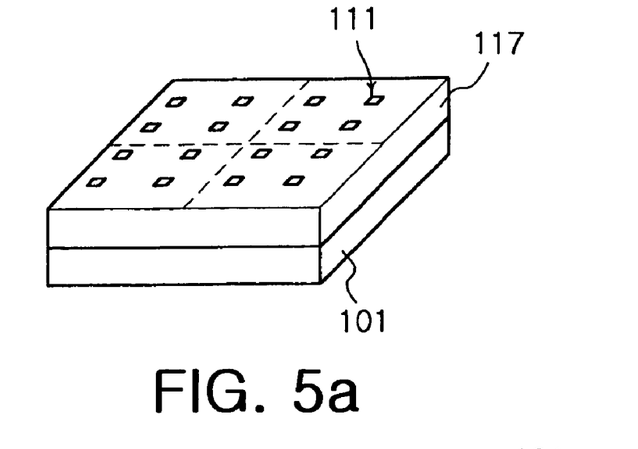
FIGS. 5a through 5f are perspective views illustrating each step of a method of fabricating the chip scale package in accordance with a preferred embodiment of the present invention.

First, as shown in FIG. 5a, a wafer 101 including a plurality of chips is prepared. Herein, each chip is divided by a dotted line of the upper surface of the wafer 101. Terminals 111 are formed on the upper surface of the wafer 101. An insulating layer 117 is formed on the upper surface of the wafer 101 except for areas for forming the terminals 111. As described above, each chip of the wafer 101 comprises four terminals on its upper surface. FIG. 5a partially shows the wafer 101. However, the whole structure of the wafer 105 with a plurality of the chips and with a predetermined diameter will be apparent to those skilled in the art.

Figure 5B:
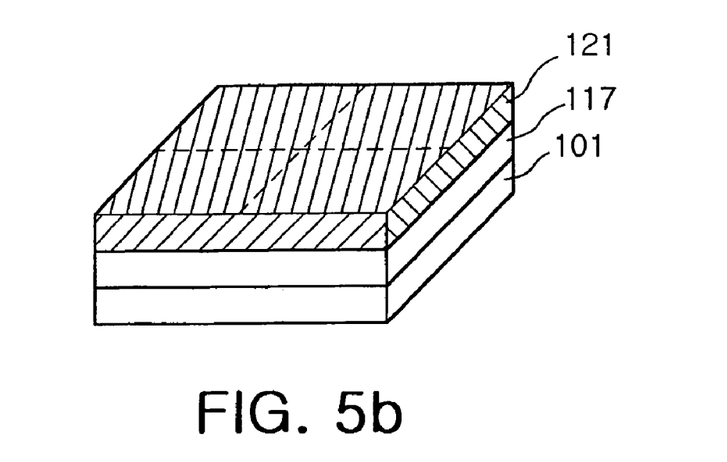

As shown in FIG. 5b, a conductive layer 121 is formed on the upper surface of the insulating layer 117 of the wafer 101. Herein, the conductive layer 121 is formed on the upper surface of the insulating layer 117 so that the conductive layer 121 is connected to the exposed four terminals 111. Therefore, preferably, the conductive layer 121 is formed by a plating method. However, as described above, most preferably, the conductive layer 121 is formed by forming a plating layer in order to fill the areas without the insulating layer 117 and then by stacking at least one copper layer on the plating layer. The conductive layer 121 may be made of copper (Cu).

Figure 5C:
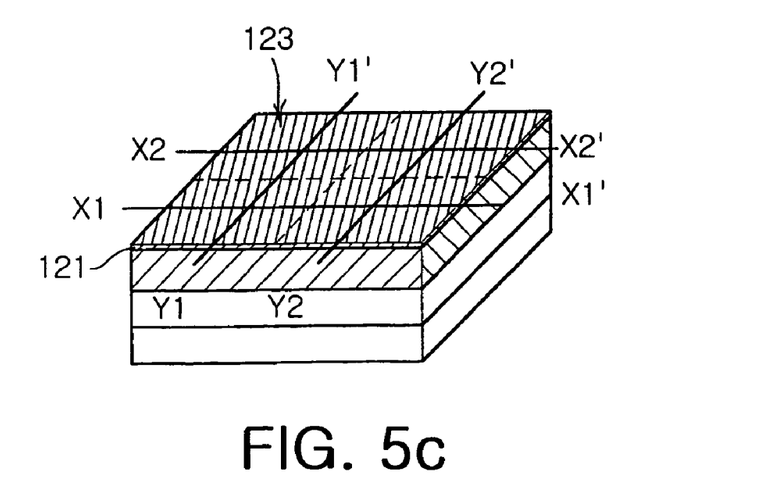

Then, as shown in FIG. 5c, an electrode surface 123 is formed on the upper surface of the conductive layer 121. The electrode surface 123 is a comparative thin layer made of metal including gold (Au) with an excellent electric conductivity as so to subsequently perform the soldering. The electrode surface 123 is easily formed by an electroplating method. After forming the electrode surface 123, parts of the conductive layer 121 are removed along the lines of X1–X1', X2–X2', Y1–Y1', and Y2–Y2' of FIG. 5c, thereby dividing the conductive layer 121 having the electrode surface 123 in plural parts.

Figure 5D:
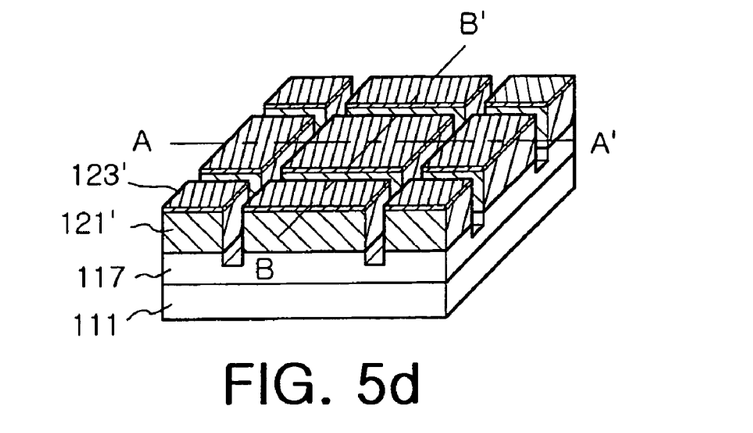

Therefore, as shown in FIG. 5d, the conductive layer 121 having the electrode surface 123 is divided into a plurality of conductive units 121', which are connected to each of the corresponding terminals, respectively. The conductive unit 121' serves as a terminal part connected to each corresponding terminal. The division of the conductive 12 into plural conductive units 121' can be easily performed by a dicing step, in which a cutting depth of a blade is controlled. The cutting depth is set to be more than the thickness of the conductive layer 121, but not to be reached to the chip. Herein, the insulating layer 117 under the conductive layer 121 serves to prevent the chip from being damaged from the division of the conductive layer 121.

Figure 5E:
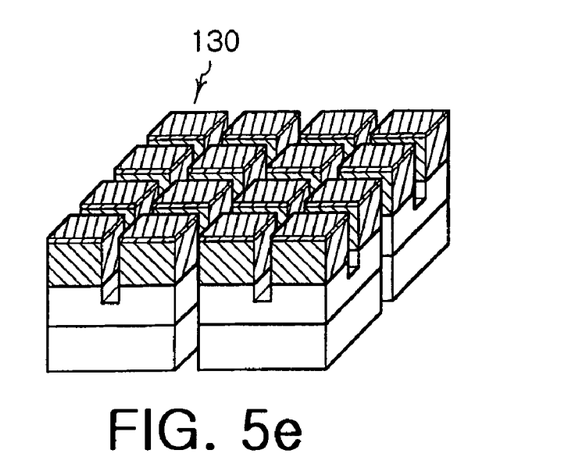

Then, as shown in FIG. 5d, the wafer 101 is diced into a plurality of package units by cutting the wafer 101 along the lines A–A' and B–B', thereby obtaining a plurality of chip scale packages 130 as shown in FIG. 5e. The dicing step of the wafer 101 into a plurality of the packages 130 can be achieved simultaneously with the step of dividing the conductive layer 121 by controlling the cutting depth.

Figure 5F:
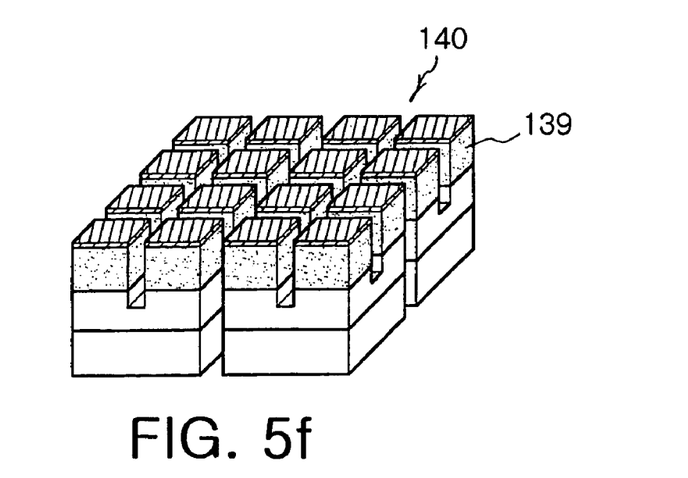

As shown in FIG. 5f, a passivation layer 139 may be further formed on the exposed surfaces of the conductive layers 121' except for the electrode surfaces 123'. The passivation layer 139 is made of an insulating film formed by coating insulating resin on the conductive layer 121'. The passivation layer 139 serves to prevent the conductive layer 121' from oxidizing, thereby improving the reliability of the chip scale package 140. If necessary, the passivation layer 139 may be omitted according to the working condition of the chip scale package 140.

In accordance with the present invention, the miniaturized chip scale package is fabricated by a series of steps of processing its one surface having a plurality of terminals. Further, the chip scale package of the present invention may be variously modified within the scope and spirit of the invention. That is, although the aforementioned preferred embodiment of the present invention discloses a chip having four terminals on its one surface, if the terminals are formed on one surface of the chip, the number and the alignment of terminals of the chip may be widely modified or improved.

As apparent from the above description, the present invention provides a chip scale package, which is miniaturized and more easily fabricated, by forming an conductive layer on one surface of the chip so as to be connected each of terminals of the surface of the chip and by forming an electrode surface on the upper surface of the conductive layer, thereby improving the reliability of the package. Further, the present invention provides a method for fabricating the chip scale package, in which the conventional wire bonding step or via hole forming step are omitted, thereby simplifying the fabrication process and reducing the fabrication cost.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A chip scale package, comprising:
   a chip having a plurality of terminals on an upper surface thereof;
   an insulating layer formed on the upper surface of the chip except for the terminals;
   a plurality of conductive layers formed on the insulating layer and spaced from each other by a designated distance, each of the conductive layers being electrically connected to one of the terminals; and
   a plurality of electrode surface layers each being formed on an upper surface of one of the conductive layers;
   wherein the conductive layers and the respective electrode surface layers formed thereon have substantially coplanar side surfaces.

2. The chip scale package as set forth in claim 1, wherein a the conductive layers have substantially the same thickness and the upper surface of each of the conductive layers is flat.

3. The chip scale package as set forth in claim 1, further comprising passivation layers formed on exposed surfaces of the conductive layers except for the upper surfaces on which the electrode surface layers are formed.

4. The chip scale package as set forth in claim 3, wherein said passivation layers are made of insulating films formed by coating insulation resin.

5. The chip scale package as set forth in claim 1, wherein the conductive layers are metal layers including copper (Cu).

6. The chip scale package as set forth in claim 1, wherein the electrode surface layers are metal layers including gold (Au).

7. The chip scale package as set forth in claim 1, wherein each of the conductive layers comprises a first layer made of a plating layer and a second layer made of at least one copper layer stacked on the first layer.

8. The chip scale package as set forth in claim 1, wherein the chip is an integrated circuit chip.

9. A chip scale package assembly, comprising:
   a chip scale package comprising:
   a chip having a plurality of terminals on an upper surface thereof;
   an insulating layer formed on the upper surface of the chip except for a the terminals;
   a plurality of conductive layers formed on the insulating layer and spaced from each other by a designated distance, each of the conductive layers being electrically connected to one of the terminals; and
   a plurality of electrode surface layers each being formed on an upper surface of one of the conductive layers;
   wherein the conductive layers and the respective electrode surface layers formed thereon have substantially coplanar side surfaces; and
   a printed circuit board comprising:
   a plurality of connection pads connected to each of the electrode surface layers of the chip scale package; and
   circuit patterns connected to each of the connection pads.

10. The chip scale package assembly as set forth in claim 9, wherein the conductive layers have substantially the same thickness and the upper surface of each of the conductive layers is flat.

11. The chip scale package assembly as set forth in claim 9, further comprising passivation layers formed on exposed surfaces of the conductive layers except for the upper surfaces on which the electrode surface layers are formed.

12. The chip scale package assembly as set forth in claim 11, wherein said passivation layers are made of insulating films formed by coating insulation resin.

13. The chip scale package assembly as set forth in claim 9, wherein the conductive layers are metal layers including copper (Cu).

14. The chip scale package assembly as set forth in claim 9, wherein the electrode surface layers are metal layers including gold (Au).

15. The chip scale package assembly as set forth in claim 9, wherein each of the conductive layers comprises a first layer made of a plating layer and a second layer made of at least one copper layer stacked on the first layer.

16. The chip scale package assembly as set forth in claim 9, wherein the chip is an integrated circuit chip.

17. The chip scale package as set forth in claim 1, further comprising a plurality of unfilled channels, wherein each of the conductive layers and the respective electrode surface layer formed thereon define an island structure which is separated from adjacent island structure or structures by one or more of said channels.

18. A chip scale package, comprising:
   a chip having a plurality of terminals on an upper surface thereof;
   an insulating layer formed on the upper surface of the chip except for the terminals;
   a plurality of conductive layers formed on the insulating layer, each of the conductive layers being electrically connected to one of the terminals;
   a plurality of electrode surface layers each being formed on an upper surface of one of the conductive layers; and
   a plurality of unfilled channels, wherein each of the conductive layers and the respective electrode surface layer formed thereon define an island structure which is separated from adjacent island structure or structures by one or more of said channels.

19. The chip scale package as set forth in claim 17, wherein said channels include side walls defined by said conductive layers and electrode surface layers; and
   bottoms defined by said insulating layer.

20. The chip scale package as set forth in claim 19, wherein said channels extend into said insulating layer, and lower portions of the side walls of said channels are defined by said insulating layer.

* * * * *